(12) United States Patent
Liu et al.

(10) Patent No.: US 7,411,223 B2
(45) Date of Patent: Aug. 12, 2008

(54) COMPOUND ELECTRODES FOR ELECTRONIC DEVICES

(75) Inventors: Jie Liu, Niskayuna, NY (US); Joseph John Shiang, Niskayuna, NY (US); Anil Raj Duggal, Niskayuna, NY (US); Christian Maria Anton Heller, Albany, NY (US)

(73) Assignee: General Electric Company, Niskayuna, NY (US)

( * ) Notice: Subject to any disclaimer, the term of this patent is extended or adjusted under 35 U.S.C. 154(b) by 516 days.

(21) Appl. No.: 10/662,083

(22) Filed: Sep. 15, 2003

(65) Prior Publication Data

US 2005/0056859 A1     Mar. 17, 2005

(51) Int. Cl.
*H01L 33/00* (2006.01)
*H01J 63/04* (2006.01)

(52) U.S. Cl. ............... 257/99; 257/741; 257/E33.063; 313/503

(58) Field of Classification Search .......... 257/107, 257/102, 101, 60, 61, 64, 99, 97, 98, 103, 257/741, E33.063, E33.064; 313/503, 506
See application file for complete search history.

(56) References Cited

U.S. PATENT DOCUMENTS

| | | | |
|---|---|---|---|
| 5,952,778 A * | 9/1999 | Haskal et al. ............... 313/504 |
| 5,965,979 A | 10/1999 | Friend et al. | |
| 5,998,803 A | 12/1999 | Forrest et al. | |
| 6,023,371 A | 2/2000 | Onitsuka et al. | |
| 6,174,613 B1 * | 1/2001 | Antoniadis et al. .......... 428/690 |
| 6,392,250 B1 | 5/2002 | Aziz et al. | |
| 6,589,673 B1 | 7/2003 | Kido et al. | |
| 6,707,248 B1 * | 3/2004 | Burroughes et al. ......... 313/504 |
| 7,015,639 B2 * | 3/2006 | Stegamat et al. ............ 313/504 |
| 2002/0053401 A1 | 5/2002 | Ishikawa et al. | |
| 2003/0022409 A1 | 1/2003 | Epstein et al. | |
| 2003/0072967 A1 | 4/2003 | Kido et al. | |
| 2004/0099305 A1 * | 5/2004 | Heller ........................ 136/263 |
| 2004/0245917 A1 * | 12/2004 | Lu et al. ..................... 313/503 |

FOREIGN PATENT DOCUMENTS

WO    WO02069412    9/2002

OTHER PUBLICATIONS

P. Piromreun et al., "Role of CsF on Electron Injection into a Conjugated Polymer," Appl. Physcs. Lett., vol. 77, No. 15, 2403 (2000).
A.R. Duggal et al., "Organic Light-Emitting Devices for Illumination Quality White Light," Appl. Phys. Lett., vol. 80, No. 19, 3470 (2002).

(Continued)

*Primary Examiner*—Minh-Loan T Tran
(74) *Attorney, Agent, or Firm*—Fletcher Yoder (57) ABSTRACT

A compound electrode comprises a first layer that comprises at least one halide compound of at least one metal selected from the group consisting of alkali metals and alkaline-earth metals; and a second layer comprising an electrically conducting material. The second layer is disposed between the first layer and an electronically active material of an electronic device. The compound electrode can serve as a cathode for an organic light-emitting device or an organic photovoltaic device. The compound electrode can be produced to be substantially transparent.

22 Claims, 4 Drawing Sheets

OTHER PUBLICATIONS

H. Suzuki et al., "Near-ultraviolet Electroluminescence from Polysilanes," Thin Solid Films, vol. 331, 64-70 (1998).

L.S. Hung et al., "Enhanced Electron Injection in Organic Electroluminescence Devices Using an Al/LiF Electrode," Appl. Phys. Lett., vol. 70, No. 2, 152 (1997).

T.M. Brown et al., "Efficient Electron Injection in Blue-Emitting Polymer Light-Emitting Diodes With LiF/Al Cathodes," Appl. Phys. Lett, vol. 79, No. 2, 174 (2001).

X. Yang et al., "Efficient Polymer Light Emitting Diodes with Metal Fluoride/Al Cathodes," Appl. Phys. Lett., vol. 79, No. 5,563 (2001).

U.S. Appl. No. 10/328,263, "White Light-Emitting Organic Electroluminescent Devices", filed Dec. 12, 2002.

U.S. Appl. No. 10/424,276, "Tandem Photovoltaic Cell Stacks" filed Apr. 28, 2003.

* cited by examiner

Fig. 12

COMPOUND ELECTRODES FOR ELECTRONIC DEVICES

BACKGROUND OF THE INVENTION

The present invention relates generally to electronic devices having at least an organic active material and, in particular, to such devices having at least a compound electrode.

Efficient operation of electronic devices depends, among other things, efficient transport of charges across an interface between an electrode and an adjacent medium. Opto-electronic devices comprise a class of electronic devices and are currently used in several applications that incorporate the principle of conversion between optical energy and electrical energy. Electroluminescent ("EL") devices, which are one type of such devices, may be classified as either organic or inorganic and are well known in graphic display and imaging art. EL devices have been produced in different shapes for many applications. Inorganic EL devices, however, typically suffer from a required high activation voltage and low brightness. On the other hand, organic EL devices ("OELDs"), which have been developed more recently, offer the benefits of lower activation voltage and higher brightness in addition to simple manufacture, and, thus, the promise of more widespread applications.

An OELD is typically a thin film structure formed on a substrate such as glass or transparent plastic. A light-emitting layer of an organic EL material and optional adjacent organic semiconductor layers are sandwiched between a cathode and an anode. The organic semiconductor layers may be either hole (positive charge)-injecting or electron (negative charge)-injecting layers and also comprise organic materials. The material for the light-emitting layer may be selected from many organic EL materials that emit light having different wavelengths. The light-emitting organic layer may itself consist of multiple sublayers, each comprising a different organic EL material. State-of-the-art organic EL materials can emit electromagnetic ("EM") radiation having narrow ranges of wavelengths in the visible spectrum. Unless specifically stated, the terms "EM radiation" and "light" are used interchangeably in this disclosure to mean generally radiation having wavelengths in the range from ultraviolet ("UV") to mid-infrared ("mid-IR") or, in other words, wavelengths in the range from about 300 nm to about 10 micrometers.

Reducing or eliminating barriers for charge injection at the organic EL layer/electrode interfaces contributes greatly to enhance the device efficiency. Metals having low work functions, such as the alkali and alkaline-earth metals, are often used in a cathode material to promote electron injection. However, these metals are susceptible to degradation upon exposure to the environment. Therefore, devices using these metals as cathode materials require rigorous encapsulation. In addition, these metals can diffuse rapidly into an adjacent organic EL layer, leading to device performance decay.

Other opto-electronic devices, such as photovoltaic cells, can also benefit from a lower barrier for electron transport across the interface between an active layer and an adjacent cathode.

Therefore, it is desirable to provide cathode materials that efficiently allow electrons to move across an interface between the cathode and an adjacent material and, at the same time, substantially preserve the long-term stability of the device.

BRIEF SUMMARY OF THE INVENTION

In general, the present invention provides a compound electrode for an electronic device, which compound electrode comprises: (a) a first layer comprising at least a halide compound of at least a metal selected from the group consisting of alkali metals and alkaline-earth metals; and (b) a second layer comprising an electrically conducting material; wherein the second layer is disposed between the first layer and an electronically active material of the electronic device.

In one aspect of the present invention, the electronic device is an opto-electronic device.

In another aspect of the present invention, the electronic device is an organic electroluminescent ("EL") device, and the active material is an organic EL material.

In another aspect of the present invention, the halide compound is fluoride.

In still another aspect of the present invention, an electronic device comprises: (a) a first electrode; (b) a second electrode; and (c) an electronically active material disposed between the first electrode and the second electrode; wherein the second electrode comprises: (1) a first layer comprising at least one halide compound of at least one metal selected from the group consisting of alkali metals and alkaline-earth metals; and (2) a second layer comprising an electrically conducting material; wherein the second layer is disposed between the first layer and the electronically active material of the electronic device.

In still another aspect of the present invention, a method for making an electronic device comprises: (a) forming a compound electrode, which comprises a first layer comprising at least a halide compound of at least a metal selected from the group consisting of alkali metals and alkaline-earth metals; and a second layer comprising an electrically conducting material; (b) disposing an electronically active material on the second layer of the compound electrode; and (c) forming an additional electrode on the electronically active material.

Other features and advantages of the present invention will be apparent from a perusal of the following detailed description of the invention and the accompanying drawings in which the same numerals refer to like elements.

It should be understood that the figures are included for illustration purposes, should not limit the invention in any way, and are not drawn to scale.

DETAILED DESCRIPTION OF THE INVENTION

The present invention provides a compound electrode for electronic devices, which compound electrode has a reduced barrier to electron transport across the interface between the compound electrode and an adjacent material. Organic EL devices and organic photovoltaic cells are non-limiting examples of electronic devices that can benefit from a compound electrode of the present invention.

In general, the present invention provides a compound electrode for an electronic device, which compound electrode comprises: (a) a first layer comprising at least one halide compound of at least one metal selected from the group consisting of alkali metals and alkaline-earth metals; and (b) a second layer comprising an electrically conducting material; wherein the second layer is disposed between the first layer and an electronically active material of the electronic device.

Figure 1:
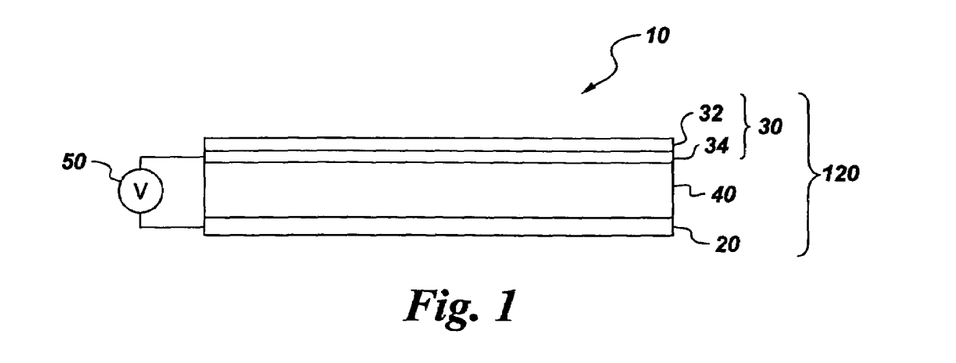
FIG. 1 illustrates an embodiment of an electronic device incorporating a compound electrode of the present invention.

FIG. 1 schematically illustrates an electronic device 10 incorporating a compound electrode of the present invention. The electronic device 10 can be an opto-electronic device that comprises: (a) an anode 20; (b) a compound cathode 30; and (c) an opto-electronically active material 40 disposed between anode 20 and cathode 30; wherein the compound cathode 30 comprises: (1) a first layer 32 comprising at least one halide compound of at least one metal selected from the group consisting of alkali metals and alkaline-earth metals; and (2) a second layer 34 comprising an electrically conducting material; wherein the second layer 34 is disposed between the first layer 32 and the opto-electronically active material 40 of the opto-electronic device 10.

In one embodiment of the present invention, the opto-electronic device 10 is an organic electroluminescent ("EL") device, in which the opto-electronically active material 40 is an organic EL material, which emits light when an electrical potential difference supplied by an electrical power source 50 is applied across anode 20 and compound cathode 30.

The first layer 32 of compound electrode 30 preferably comprises at least one fluoride compound of at least one metal selected from the group consisting of alkali metals; more preferably at least one fluoride compound of at least one alkali metal selected from the group consisting of sodium, potassium, and cesium; and most preferably at least one fluoride compound of at least one alkali metal selected from the group consisting of sodium and potassium. The second layer 34 of compound electrode 30 comprises an electrically conducting material, such as a metal selected from the group consisting of aluminum, silver, gold, tin, calcium, magnesium, mixtures thereof, and alloys thereof. The second layer 34 also can comprise a material selected from yttrium, scandium, elements of the lanthanide series, mixtures thereof, and alloys thereof. Preferably, the second layer 34 comprises aluminum.

Figure 2:
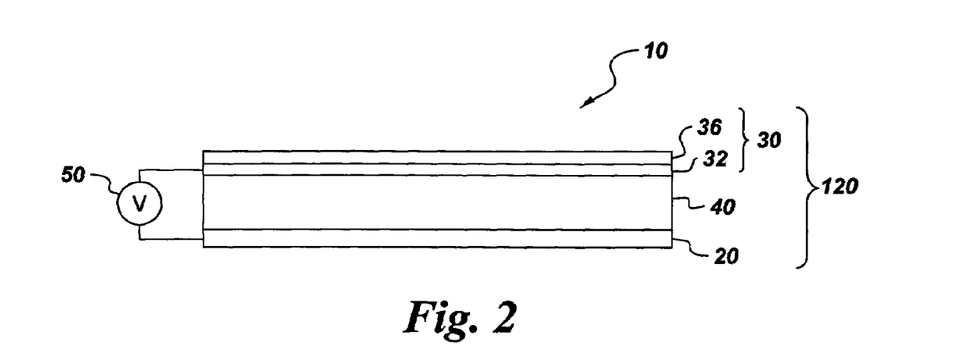
FIG. 2 illustrates another embodiment of an electronic device incorporating a compound electrode of the present invention, wherein the compound electrode comprises a substantially transparent layer.

In another embodiment, which is illustrated in FIG. 2, wherein it is desirable to provide a substantially transparent cathode, compound electrode or cathode 30 can comprise: (1) an inorganic halide layer 32 that comprises at least a halide compound of a metal selected from the group consisting of alkaline and alkaline earth metals; and (2) a substantially transparent, electrically conducting layer 36. The term "substantially transparent" means allowing at least 50 percent, preferably at least 80 percent, and more preferably at least 90 percent, of light in the visible wavelength range transmitted through a film having a thickness of about 0.5 micrometer, at an incident angle of less than or equal to 10 degrees. Layer 32 comprises a halide compound chosen from among those listed above. Layer 36 comprises a substantially transparent, electrically conducting material, such as a substantially transparent, electrically conducting metal oxide, for example, a material selected from the group consisting of indium tin oxide ("ITO"), tin oxide, indium oxide, zinc oxide, indium zinc oxide, zinc indium tin oxide, antimony oxide, and mixtures thereof. The thickness of layer 36 is in the range from about 10 nm to about 500 nm, preferably from about 10 nm to about 200 nm, and more preferably from about 50 nm to about 200 nm.

Figure 3:
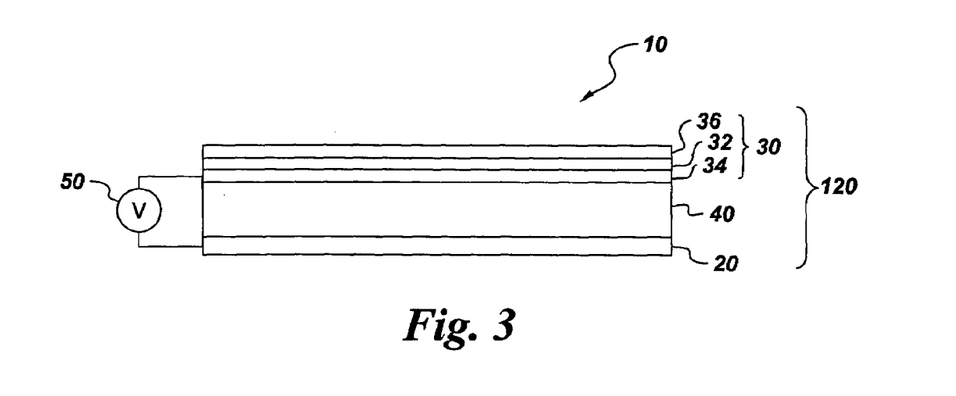
FIG. 3 illustrates another embodiment of an electronic device incorporating a compound electrode of the present invention, wherein the compound electrode comprises a substantially transparent layer and a conducting layer.

In another embodiment, which is illustrated in FIG. 3, the compound electrode or cathode 30 comprises: (1) an electrically conducting metal layer 34 that comprises at least a material selected from the group consisting of aluminum, silver, gold, tin, calcium, magnesium, yttrium, scandium, elements of the lanthanide series, mixtures thereof, and alloys thereof; (2) an inorganic halide layer 32 that comprises at least a halide compound of a metal selected from the group consisting of alkaline and alkaline earth metals; and (3) a substantially transparent, electrically conducting layer 36. Layer 36 comprises a substantially transparent, electrically conducting material, such as a substantially transparent, electrically conducting metal oxide, for example, a metal oxide selected from group consisting of indium tin oxide ("ITO"), tin oxide, indium oxide, zinc oxide, indium zinc oxide, zinc indium tin oxide, antimony oxide, and mixtures thereof. Preferably, the material of layer 34 is aluminum, and the material of layer 36 is ITO. Layer 32 comprises a halide compound of at least a metal selected from the group consisting of alkali and alkaline-earth metals. Layer 32 preferably comprises a fluoride of at least an alkali metal selected from the group consisting of sodium, potassium, and cesium; and more preferably, a fluoride of at least an alkali metal selected from the group consisting of sodium and potassium.

According to one aspect of the present invention, layers 32, 34, and 36 are deposited on an underlying layer or material by a method selected from the group consisting of physical vapor deposition, chemical vapor deposition, and sputtering. Layer 34 has a thickness in the range from about 1 nm to about 40 nm, preferably from about 1 nm to about 20 nm, and more preferably from about 10 nm to about 20 nm. Layer 32 has a thickness in the range from about 1 nm to about 100 nm, preferably from about 4 nm to about 40 nm, and more preferably from about 4 nm to about 10 nm.

According to another aspect of the present invention, layer 32 is supported on a substrate made of a material such as a glass, a metal, or an electrically conducting oxide (such as indium tin oxide ("ITO"), tin oxide, indium oxide, zinc oxide, indium zinc oxide, zinc indium tin oxide, antimony oxide, and mixtures thereof). Layer 34 is then deposited on layer 32, preferably from the vapor phase. Although the applicants do not wish to be bound by any particular theory, it is believed that a metal vapor, such as aluminum vapor, dissociates the halide compound, such as an alkali halide or an alkaline-earth halide, into alkali or alkaline-earth metal, and aluminum halide. The alkali or alkaline-earth metal atoms subsequently diffuse to the surface of the layer 34 away from the metal halide layer 32. When the metal layer 34 is disposed adjacent to the opto-electronically active material 40, an alkali or alkaline-earth metal present at the interface lowers the barrier for electron transport across such interface.

The anode 20 of opto-electronic device 10 comprises a material having a high work function; e.g., greater than about 4.4 eV, for example from about 5 eV to about 7 eV. ITO is typically used for this purpose. ITO is substantially transparent to light transmission and allows light emitted from organic electroluminescent layer 40 easily to escape through the ITO anode layer without being seriously attenuated. Other materials suitable for use as the anode layer are tin oxide, indium oxide, zinc oxide, indium zinc oxide, zinc indium tin oxide, antimony oxide, and mixtures thereof. Anode layer 20 may be deposited on the underlying element by physical vapor deposition, chemical vapor deposition, or sputtering. The thickness of an anode comprising such an electrically conducting oxide can be in the range from about 10 nm to about 500 nm, preferably from about 10 nm to about 200 nm, and more preferably from about 50 nm to about 200 nm. A thin, substantially transparent layer of a metal is also suitable; for example, a layer having a thickness less than about 50 nm, preferably less than about 20 nm. Suitable metals for the anode 20 are those having high work function, such as greater than about 4.4 eV, for example, silver, copper, tungsten, nickel, cobalt, iron, selenium, germanium, gold, platinum, aluminum, or mixtures or alloys thereof. In an embodiment, wherein the transparency of the anode 20 is not critical, its thickness can be greater than about 50 nm.

Figure 4:
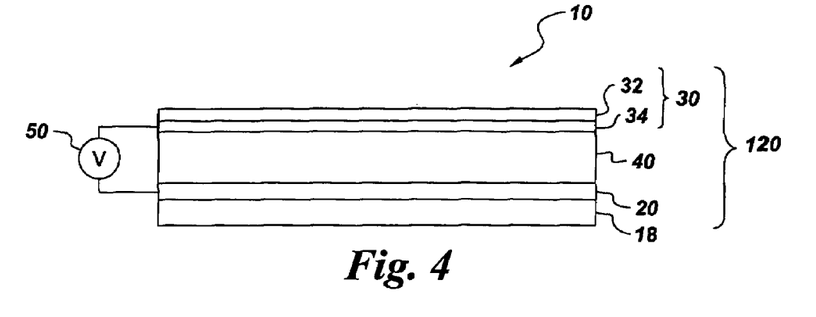
FIG. 4 illustrates another embodiment of an electronic device incorporating a compound electrode of the present invention, wherein the device is supported on a substrate.

In one embodiment, as illustrated in FIG. 4, anode layer 20 is supported on a substantially transparent substrate 18, which is made of a substantially transparent glass or polymeric material.

Figure 5:
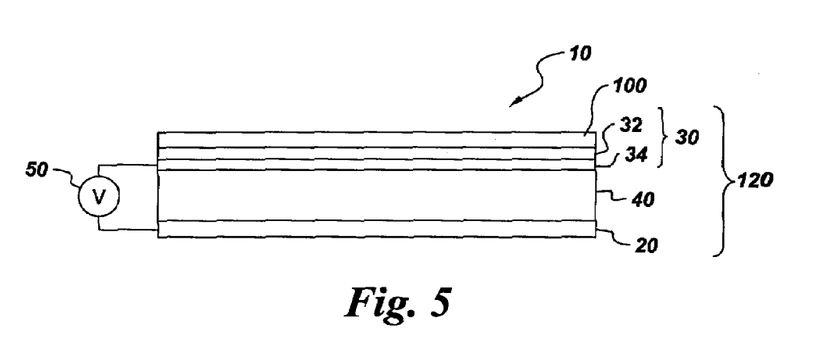
FIG. 5 illustrates another embodiment of an electronic device incorporating a compound electrode of the present invention, wherein the compound electrode is protected by a protective layer.

Opto-electronic device 10 can advantageously include a protective layer 100 disposed on cathode layer 30, as illustrated in FIG. 5, to provide protection against physical damage or chemical attack to the sensitive components of device 10. Protective layer 100 can comprise a substantially transparent polymer or a glass.

In one embodiment, opto-electronic device 10 is a light-emitting device, wherein organic EL layer 40 serves as the transport medium for both holes and electrons. In this layer these charge species combine to form an exciton and drop to a lower energy level, concurrently emitting EM radiation in the visible range. For example, one organic EL material is chosen to electroluminesce in the blue region (having wavelength in the range from about 380 nm to about 500 nm). Other organic materials, which electroluminesce either in other wavelength regions, may be incorporated in the opto-electronic device 10. The thickness of the organic EL layer 40 is preferably kept in the range of about 100 to about 300 nm. The organic EL material may be a polymer, a copolymer, a mixture of polymers, or lower molecular-weight organic molecules having unsaturated bonds. Such materials possess a delocalized $\pi$-electron system, which gives the polymer chains or organic molecules the ability to support positive and negative charge carriers with high mobility.

Suitable blue light-emitting EL polymers are poly(N-vinylcarbazole) ("PVK", emitting violet-to-blue light in the wavelengths of about 380-500 nm); poly(alkylfluorene) such as poly(9,9-dihexylfluorene) (410-550 nm), poly(dioctylfluorene) (wavelength at peak EL emission of 436 nm), or poly{9,9-bis(3,6-dioxaheptyl)-fluorene-2,7-diyl} (400-550 nm); poly(praraphenylene) and its derivatives such as poly(2-decyloxy-1,4-phenylene) (400-550 nm). Mixtures of these polymers or copolymers based on one or more of these polymers and others may be used to tune the color of emitted light.

Another class of suitable EL polymers emitting blue light is the polysilanes. Polysilanes are linear silicon-backbone polymers substituted with a variety of alkyl and/or aryl side groups. They are quasi one-dimensional materials with delocalized a-conjugated electrons along polymer backbone chains. Examples of polysilanes are poly(di-n-butylsilane), poly(di-n-pentylsilane), poly(di-n-hexylsilane), poly(methylphenylsilane), and poly{bis(p-butylphenyl)silane} which are disclosed in H. Suzuki et al., "Near-Ultraviolet Electroluminescence From Polysilanes," 331 Thin Solid Films 64-70 (1998). These polysilanes emit light having wavelengths in the range from about 320 nm to about 420 nm.

Organic materials having molecular weight less than, for example, about 10000 that are made of a large number of aromatic units are also applicable blue light-emitting materials. An example of such materials is 1,3,5-tris{n-(4-diphenylaminophenyl) phenylamino}benzene, which emits light in the wavelength range of 380-500 nm. The organic EL layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415-457 nm, aluminum-(picolymethylketone)-bis {2,6-di(t-butyl)phenoxide} or scandium-(4-methoxy-picolymethylketone)-bis(acetylacetonate), which emits in the range of 420-433 nm.

Organic EL layer 40 of light-emitting device 10 can comprise materials that emit light in other visible wavelengths. For example, red light-emitting organic EL materials are disclosed in U.S. patent application having Ser. No. 10/328, 263 filed on Dec. 23, 2002, entitled "White Light-Emitting Organic Electroluminescent Devices," having the same assignee, which patent application is incorporated herein by reference in its entirety.

Other suitable organic EL materials that emit in the visible wavelength range are organo-metalic complexes of 8-hydroxyquinoline, such as tris(8-quinolinolato)aluminum and its derivatives.

Organic EL layer 40 can be deposited on an underlying layer by a method such as physical vapor deposition, spin coating, spray coating, dip coating, roller coating, or ink-jet printing.

An assemblage, which comprises anode 20, cathode 30, and EL layer 40, is herein called a "light-emitting member," and is designated by numeral 120.

Figure 6:
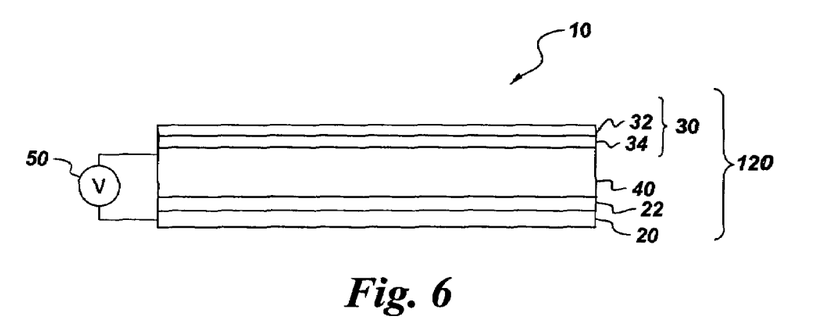
FIG. 6 illustrates another embodiment of an electronic device incorporating a compound electrode of the present invention, wherein the device also comprises a hole injection enhancement layer.

Beside organic EL layer 40, one or more additional organic layers may be included in light-emitting member 120 to increase the efficiency of the overall device 10. For example, these additional layers can serve to improve the injection (electron or hole injection enhancement layers) or transport (electron or hole transport layers) of charges into the organic EL layer. The thickness of each of these layers is kept to below about 500 nm, preferably below about 100 nm. They may be applied during the manufacture of the device 10 by conventional methods such as spin coating, spray coating, dip coating, roller coating, or physical or chemical vapor deposition. In one embodiment of the present invention, as shown in FIG. 6, a hole injection enhancement layer 22 is formed between anode layer 20 and organic EL layer 40 to provide a higher injected current at a given forward bias and/or a higher maximum current before the failure of the device. Thus, the hole injection enhancement layer facilitates the injection of holes from the anode. Suitable materials for the hole injection enhancement layer are p-doped conducting polymers, such as poly(3,4-ethylenedioxythiophene) ("PEDOT"), polyaniline, or arylene-based compounds disclosed in U.S. Pat. No. 5,998, 803 incorporated herein by reference; such as 3,4,9,10-perylenetetra-carboxylic dianhydride or bis(1,2,5-thiadiazolo)-p-quinobis(1,3-dithiole).

Figure 7:
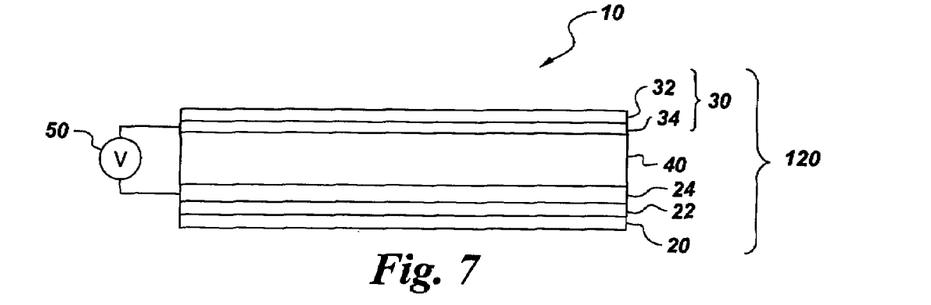
FIG. 7 illustrates another embodiment of an electronic device incorporating a compound electrode of the present invention, wherein the device also comprises a hole injection enhancement layer and a hole transport layer.

In another embodiment of the present invention, as shown in FIG. 7, light-emitting member 120 further includes a hole transport layer 24 which is disposed between hole injection enhancement layer 22 and organic EL layer 40. Hole transport layer 24 has the functions of transporting holes and blocking the transportation of electrons so that holes and electrons are optimally combined in organic EL layer 40. Materials suitable for the hole. transport layer are triaryldiamine, tetraphenyldiamine, aromatic tertiary amines, hydrazone derivatives, carbazole derivatives, triazole derivatives, imidazole derivatives, oxadiazole derivatives having an amino group, polymers thereof, mixtures thereof, and polythiophenes as disclosed in U.S. Pat. No. 6,023,371 incorporated herein by reference.

Figure 8:
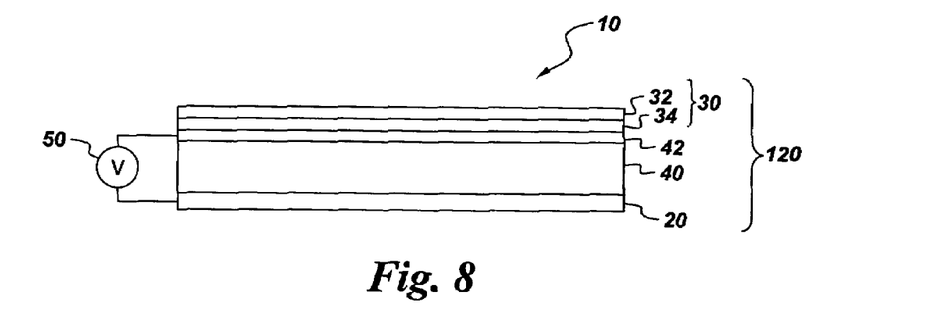
FIG. 8 illustrates another embodiment of an electronic device incorporating a compound electrode of the present invention, wherein the device also comprises an electron injecting and transporting layer.

In still another embodiment of the present invention, as shown schematically in FIG. 8, light-emitting member 120 includes an additional layer 42 which is disposed between the electrically conducting layer 34 of cathode 30 and organic EL layer 40. Layer 42 has the combined function of injecting and transporting electrons to organic EL layer 40. Materials suitable for the electron injecting and transporting layer are metal organic complexes of 8-hydroxyquinoline, such as tris(8-quinolinolato)aluminum; stilbene derivatives; anthracene derivatives; perylene derivatives; metal thioxinoid compounds; oxadiazole derivatives and metal chelates; pyridine derivatives; pyrimidine derivatives; quinoline derivatives; quinoxaline derivatives; diphenylquinone derivatives; nitro-substituted fluorene derivatives; and triazines; as disclosed in U.S. Pat. Nos. 6,023,371 and 6,392,250, which are incorporated herein by reference.

Figure 9:
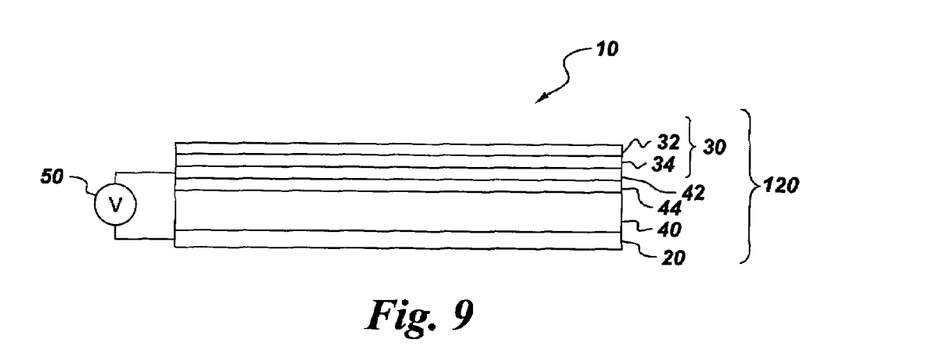
FIG. 9 illustrates another embodiment of an electronic device incorporating a compound electrode of the present invention, wherein the device also comprises an electron injecting and transporting layer and a hole-blocking layer.

In another embodiment of the present invention, as shown in FIG. 9, a hole-blocking layer 44 is disposed between electron injecting and transporting layer 42 and EL layer 40. Hole blocking layer 44 serves to prevent holes from reaching cathode 30 where they are uselessly lost. Generally, electron-transporting materials, such as those disclosed above, also have hole blocking property. In particular, suitable materials for hole blocking layer 44 are poly(N-vinyl carbazole), bathocurpoine ("BCP"), bis(2-methyl-8-quinolinato)triphenylsilanolate aluminum (III), bis(2-methyl-8-quinolinato)4-phenolate aluminum (III), and bis(2-methyl-8-quinolinato)4-phenylphenolate aluminum (III).

Figure 10:
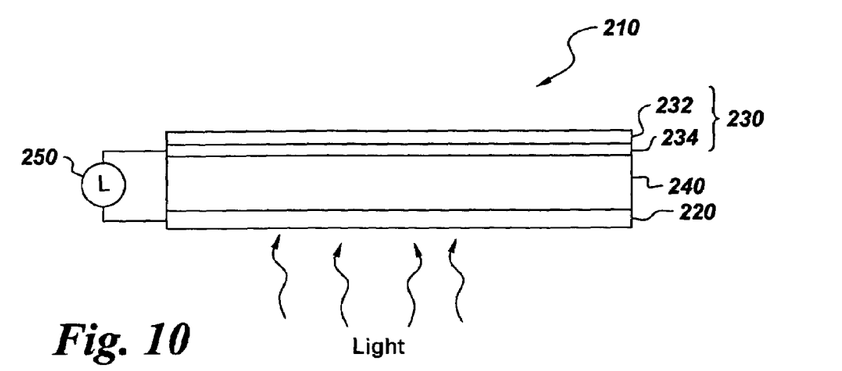
FIG. 10 illustrates a PV cell incorporating a compound electrode of the present invention.

Another type of opto-electronic devices, which can benefit from an efficient transport of electrons across an interface between an electrode and an adjacent opto-electronically active material, are photovoltaic ("PV") cells. A compound electrode of the present invention can be incorporated beneficially into such PV cells. FIG. 10 shows schematically a PV cell 210 comprises a pair of electrodes 220 and 230 and a light-absorbing PV material 240 disposed therebetween. When the PV material 240 is irradiated with light, electrons that have been confined to an atom in the PV material 240 are released by light energy to move freely. Thus, free electrons and holes are generated. Free electrons and holes are efficiently separated so that electric energy is continuously extracted. Free electrons move through the semiconductor PV material 240 and flow through one of the electrodes, for example, electrode 230 (sometimes also known as the solar electrode or electron-generating electrode). In one embodiment, electrode 230 is a compound electrode of the present invention, and comprises: (1) a first layer 232 comprising at least one halide compound of at least one metal selected from the group consisting of alkali metals and alkaline-earth metals; and (2) a second layer 234 comprising an electrically conducting material; wherein the second layer 234 is disposed between the first layer 232 and the PV material 240 of PV cell 210. Electrical load 250 is connected to electrodes 220 and 230 to complete an electrical circuit.

Many types of PV materials 240 can be used with an embodiment of the present invention. For example, PV material 240 may be silicon semiconductor material, a semiconductor material such as $TiO_2$ sensitized with a photon-absorbing organic dye (or chromophore), or a pair of organic semiconducting materials comprising an electron donor material and an electron acceptor material. Non-limiting examples of semiconductor materials are disclosed in U.S. patent application having Ser. No. 10/424,276, filed on Jun. 23, 2003, entitled "Tandem Photovoltaic Cell Stacks," having the same assignee, which patent application is incorporated herein by reference in its entirety.

Electrode 220 comprises a material selected from the group consisting of materials of electrode 20 disclosed above in conjunction with light-emitting device 10. Layers 232 and 234 of electrode 230 comprise materials selected from those disclosed above in conjunction with layer 32 and 34, respectively.

Figure 11:
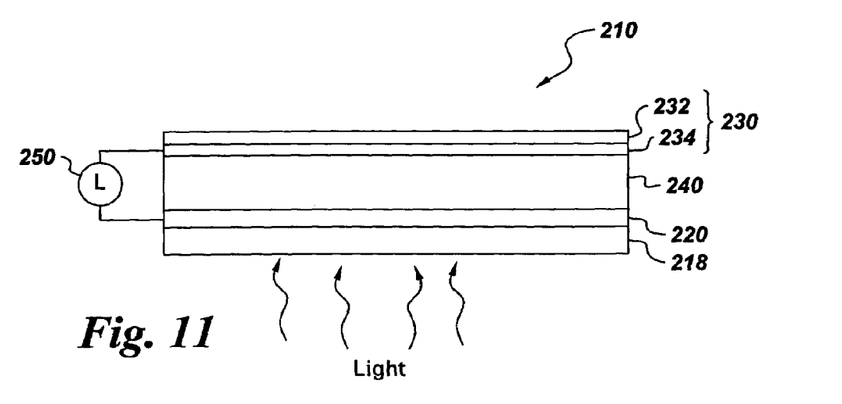
FIG. 11 illustrates a PV cell incorporating a compound electrode of the present invention, supported on a substrate.

In another embodiment, as illustrated in FIG. 11, electrode 220 can be supported on a substantially transparent substrate 218 comprising a glass or a polymeric material.

Figure 12:
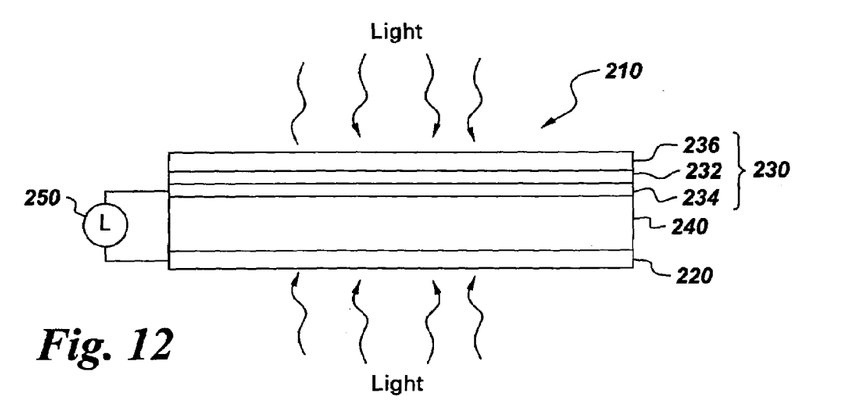
FIG. 12 illustrates a PV cell incorporating a compound electrode of the present invention, wherein light can be absorbed from both sides of the PV cell.

Alternatively, as illustrated in FIG. 12, it may be desirable to allow light to penetrate both electrodes 220 and 230, which are substantially transparent. In such as case, layer 234 of electrode 230 can be very thin, such as having a thickness of about 1 nm to about 40 nm, preferably less than 20 nm. A layer 236 that comprises a substantially transparent, electrically conducting oxide is disposed on the halide layer 232. Materials suitable for layer 236 are those disclosed above for layer 36 of light-emitting device 10.

A method of making an electronic device that has a compound electrode is now described. The method comprises: (a) forming a compound electrode, which comprises a first layer comprising at least a halide compound of at least a metal selected from the group consisting of alkali metals and alkaline-earth metals; and a second layer comprising an electrically conducting material; (b) disposing an electronically active material on the second layer of the compound electrode; and (c) forming an additional electrode on the electronically active material.

In another embodiment, forming the compound cathode comprises depositing an electrically conducting material, such as a material selected from the group consisting of aluminum, silver, god, tin, calcium, magnesium, yttrium, scandium, elements of the lanthanide series, mixtures thereof, and alloys thereof, on the first layer comprising said at least a halide compound.

The formation of an inorganic or metallic layer, such as a layer of the compound electrode or the anode, can be carried out by a method such as physical vapor deposition, chemical vapor deposition, or sputtering.

The formation of an organic layer, such as a layer of an organic light-emitting material or a layer of an organic PV material, can be carried out by a method such as spin coating, spray coating, dip coating, roller coating, ink-jet printing, physical vapor deposition, or chemical vapor deposition.

Alternatively, the method of making an electronic device comprises: (a) providing a first substrate; (b) forming a first layer on the first substrate, the first layer comprising at least a halide compound of at least a metal selected from the group consisting of alkali metals and alkaline-earth metals; (c) forming a second layer on the first layer, the second layer comprising an electrically conducting material; (d) forming a third layer on the second layer, the third layer comprising an electronically active material; and (e) forming a fourth layer on the third layer, the fourth layer comprising a substantially transparent, electrically conducting material.

In one embodiment, the electrically conducting material of the second layer comprises a material selected from the group consisting of aluminum, silver, gold, tin, yttrium, scandium, elements of the lanthanide series, mixtures thereof, and alloys thereof. Preferably, the second layer comprises aluminum.

In another embodiment, the substantially transparent, electrically conducting material of the fourth layer comprises a substantially transparent, electrically conducting metal oxide selected from the group consisting of ITO, tin oxide, indium oxide, zinc oxide, indium zinc oxide, zinc indium tin oxide, antimony oxide, and mixtures thereof.

In still another embodiment of the present invention, the method of making an electronic device comprises: (a) forming a first article, the forming of the first article comprising: (1) providing a first substrate; (2) forming a first layer on the first substrate, the first layer comprising at least a halide compound of at least a metal selected from the group consisting of alkali metals and alkaline-earth metals; (3) forming a second layer on the first layer, the second layer comprising an electrically conducting material; and (4) forming a third layer on the second layer, the third layer comprising an electronically active material; (b) forming a second article, the forming of the second article comprising: (1) providing a second substrate; and (2) forming a fourth layer on the second substrate, the fourth layer comprising a substantially transparent, electrically conducting material; and (c) laminating together the first article and the second article such that the fourth layer is disposed adjacent to the third layer.

In still another embodiment of the present invention, the method of making an electronic device comprises: (a) forming a first article, the forming of the first article comprising: (1) providing a first substrate; (2) forming a first layer on the first substrate, the first layer comprising at least a halide compound of at least a metal selected from the group consisting of alkali metals and alkaline-earth metals; and (3) forming a second layer on the first layer, the second layer comprising an electrically conducting material; (b) forming a second article, the forming of the second article comprising: (1) providing a second substrate; (2) forming a fourth layer on the second substrate, the fourth layer comprising a substantially transparent, electrically conducting material; and (3) forming a third layer on the fourth layer, the third layer comprising an electronically active material; and (c) laminating together the first article and the second article such that the second layer is disposed adjacent to the third layer.

In still another embodiment, laminating together the first article and the second article is carried out by applying heat or pressure to the articles after they are brought together.

In another embodiment of the present invention, the method of making an electronic device, such as an optoelectronic device, comprises: (a) forming a first article, the forming of the first article comprising: (1) providing a first substrate; (2) forming a first layer on the first substrate, the first layer comprising at least a halide compound of at least a metal selected from the group consisting of alkali metals and alkaline-earth metals; (3) forming a second layer on the first layer, the second layer comprising an electrically conducting material; and (4) forming a protective layer on the second layer, the protective layer comprising a material that is capable of being removed to expose the second layer; (b) removing the protective layer to expose the second layer; (c) forming a third layer on the second layer, the third layer comprising an electronically active material, such as an optoelectronically active material; and (d) forming a fourth layer on the third layer, the fourth layer comprising a substantially transparent, electrically conducting material.

In still another embodiment, removing the protective layer is carried out in an enclosure, which provides a clean environment to prevent an attack by chemically reactive species present in the environment on the material comprising the first and second layers.

In yet another embodiment, the protective layer can be an organic polymer, and removing the protective layer is carried out by a method such as heating or laser ablation.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. An electronic device comprising:
   (a) a first electrode;
   (b) a second electrode that comprises:
      (1) a first layer comprising at least a halide compound of at least a metal selected from the group consisting of sodium and potassium; and
      (2) a second layer comprising an electrically conducting material; and
   (c) at least an electronically active material disposed between the first electrode and the second electrode;
   wherein the second layer is disposed between the first layer and the electronically active material of the electronic device.

2. The electronic device according to claim 1, wherein the first layer of the second electrode comprises at least a fluoride compound.

3. The electronic device according to claim 1, wherein the first layer of the second electrode has a thickness in a range from about 1 nm to about 100 nm.

4. The electronic device according to claim 1, wherein the second layer of the second electrode comprises a material selected from the group consisting of aluminum, silver, gold, tin, calcium, magnesium, yttrium, scandium, elements of lanthanide series, mixtures thereof, and alloys thereof.

5. The electronic device according to claim 1, wherein the second layer of the second electrode comprises aluminum.

6. The electronic device according to claim 5, wherein the second layer of the second electrode has a thickness in a range from about 1 nm to about 40 nm.

7. The electronic device according to claim 1, wherein the first electrode comprises a metal oxide selected from the group consisting of indium tin oxide ("ITO"), tin oxide, indium oxide, zinc oxide, indium zinc oxide, zinc indium tin oxide, antimony oxide, and mixtures thereof.

8. The electronic device according to claim 1, wherein the first electrode comprises at least a metal selected from the group consisting of silver, copper, tungsten, nickel, cobalt, iron, selenium, germanium, gold, platinum, and aluminum.

9. The electronic device according to claim 1, wherein the electronic device is an organic light-emitting device, and the opto-electronically active material is selected from the group consisting of poly(N-vinylcarbazole) ("PVK");
poly(alkylfluorene), poly(praraphenylene), polysilanes, 1,3,5-tris {n-(4-diphenylaminophenyl) phenylamino}benzene, phenylanthracene, tetraarylethene, coumarin, rubrene, tetraphenylbutadiene, anthracene, perylene, coronene, and derivatives thereof.

10. The electronic device according to claim 1, wherein the electronic device is an organic light-emitting device, and the electronically active material is an opto-electronically active material and is selected from the group consisting of aluminum-acetylacetonate, gallium- acetylacetonate, indium-acetylacetonate, aluminum-(picolymethylketone) -bis {2,6-di(t-butyl)phenoxide}, and scandium-(4-methoxy-picolylmethylketone) -bis(acetylacetonate).

11. The electronic device according to claim 1, wherein the electronic device is an organic light-emitting device, and the electronically active material is an opto-electronically active material and is selected from the group consisting of tris (8-quinolinolato) aluminum and derivatives thereof.

12. The electronic device according to claim 1, further comprising an additional layer that comprises a substantially transparent, electrically conducting material disposed on the first layer of the second electrode.

13. The electronic device according to claim 12, wherein the second layer of the second electrode comprises aluminum and has a thickness in the range from about 1 nm to about 40 nm, and the additional layer comprises a metal oxide selected from the group consisting of ITO, tin oxide, indium oxide, zinc oxide, indium zinc oxide, zinc indium tin oxide, antimony oxide, and mixtures thereof.

14. The electronic device according to claim 13, wherein the first electrode comprises a metal oxide selected from the group consisting of ITO, tin oxide, indium oxide, zinc oxide, indium zinc oxide, zinc indium tin oxide, antimony oxide, and mixtures thereof.

15. The electronic device according to claim 14, wherein the electronic device is a photovoltaic ("PV") cell, and the electronically active material is a PV material.

16. An light-emitting device comprising:
(a) a first electrode;
(b) a second electrode that comprises:
    (1) a first layer comprising at least a fluoride compound of at least a metal selected from the group consisting of sodium and potassium, the first layer having a thickness in a range from about 1 nm to about 100 nm; and
    (2) a second layer comprising aluminum and having a thickness in a range from about 1 nm to about 40 nm; and
(c) an organic light-emitting material disposed between the first electrode and the second electrode, the organic light-emitting material comprising a polyfluorene;
wherein the second layer is disposed between the first layer and the organic light-emitting material of the electronic device.

17. A compound electrode comprising:
(a) a first layer comprising at least a halide compound of at least a metal selected from the group consisting of sodium and potassium; and
(b) a second layer comprising an electrically conducting material; wherein the second layer is in contact with an electronically active material.

18. The compound electrode according to claim 17, wherein the first layer of the compound electrode comprises at least a fluoride compound.

19. The compound electrode according to claim 17, wherein the first layer of the compound electrode has a thickness in a range from about 1 nm to about 100 nm.

20. The compound electrode according to claim 17, wherein the second layer of the compound electrode comprises a metal selected from the group consisting of aluminum, silver, gold, tin, calcium, magnesium, yttrium, scandium, elements of lanthanide series, mixtures thereof, and alloys thereof.

21. The compound electrode according to claim 17, wherein the second layer of the compound electrode comprises aluminum.

22. The compound electrode according to claim 21, wherein the second layer of the compound electrode comprises aluminum and has a thickness in a range from about 1 nm to about 40 nm.

* * * * *

UNITED STATES PATENT AND TRADEMARK OFFICE
CERTIFICATE OF CORRECTION

PATENT NO. : 7,411,223 B2 Page 1 of 1
APPLICATION NO. : 10/662083
DATED : August 12, 2008
INVENTOR(S) : Liu et al.

It is certified that error appears in the above-identified patent and that said Letters Patent is hereby corrected as shown below:

In Column 6, Line 7, delete "poly(praraphenylene)" and insert
-- poly(paraphenylene) --, therefor.

In Column 6, Line 15, delete "a-conjugated" and insert -- σ-conjugated --, therefor.

In Column 11, Line 9, in Claim 9, delete "poly(praraphenylene)," and insert
-- poly(paraphenylene), --, therefor.

Signed and Sealed this

Seventeenth Day of March, 2009

JOHN DOLL
*Acting Director of the United States Patent and Trademark Office*